(12) United States Patent
Cheng et al.

(10) Patent No.: US 9,318,465 B2
(45) Date of Patent: *Apr. 19, 2016

(54) METHODS FOR FORMING A SEMICONDUCTOR DEVICE PACKAGE

(71) Applicant: TAIWAN SEMICONDUCTOR MANUFACTURING COMPANY, LTD., Hsinchu (TW)

(72) Inventors: Jung Wei Cheng, Hsinchu (TW); Tsung-Ding Wang, Tainan (TW); Chien-Hsun Lee, Chu-tung Town (TW); Chun-Chih Chuang, Taichung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/681,149

(22) Filed: Apr. 8, 2015

(65) Prior Publication Data

US 2015/0214181 A1 Jul. 30, 2015

Related U.S. Application Data

(63) Continuation of application No. 14/212,233, filed on Mar. 14, 2014, now Pat. No. 9,006,032, which is a continuation of application No. 13/586,629, filed on Aug. 15, 2012, now Pat. No. 8,704,354.

(60) Provisional application No. 61/616,958, filed on Mar. 28, 2012.

(51) Int. Cl.
*H01L 21/00* (2006.01)
*H01L 23/00* (2006.01)
(Continued)

(52) U.S. Cl.
CPC .............. *H01L 24/81* (2013.01); *H01L 21/56* (2013.01); *H01L 23/3114* (2013.01);
(Continued)

(58) Field of Classification Search
CPC ....... H01L 23/315; H01L 24/06; H01L 24/81; H01L 25/0657; H01L 23/49811; H01L 2224/73204; H01L 21/56; H01L 24/13; H01L 24/15; H01L 24/16; H01L 2224/0401; H01L 2224/05571; H01L 2224/06155; H01L 2224/16145; H01L 2225/0652; H01L 2225/1058
USPC ..... 438/109, FOR. 368, FOR. 426, 124, 127; 257/E23.033, E23.068, E23.069, 257/E25.006
See application file for complete search history.

(56) References Cited

U.S. PATENT DOCUMENTS 7,714,453 B2 5/2010 Khan et al.
7,737,539 B2 6/2010 Kwon et al.
(Continued)

OTHER PUBLICATIONS

CJ, Bill, et al., "Advanced QFN Packaging for Low Cost and Solution", 2010 11th International Conference on Electronic Packaging Technology & High Density Packaging, pp. 45-49.

(Continued)

*Primary Examiner* — Jasmine Clark
(74) *Attorney, Agent, or Firm* — Hauptman Ham, LLP

(57) ABSTRACT

A method of forming a semiconductor device package includes bonding a first connector to a first conductive structure on a first package. The method includes bonding a die to a surface of the first package, wherein a top surface of the first connector extends above a top surface of the die. The method includes surrounding the first connector with a molding compound. The method includes removing a portion of the first connector and a portion of the molding compound. The top surface of the remaining first conductor is below the top surface of the die. A first top surface of the remaining molding compound is below the top surface of the die. A second top surface of the remaining molding compound is level with the top surface of the die. The method includes bonding a second connector to the remaining portion of the first connector.

20 Claims, 18 Drawing Sheets

(51) Int. Cl.
*H01L 23/31* (2006.01)
*H01L 25/065* (2006.01)
*H01L 25/10* (2006.01)
*H01L 23/498* (2006.01)
*H01L 21/56* (2006.01)

(52) U.S. Cl.
CPC ..... *H01L 23/3121* (2013.01); *H01L 23/49811* (2013.01); *H01L 24/05* (2013.01); *H01L 24/85* (2013.01); *H01L 25/0657* (2013.01); *H01L 25/105* (2013.01); *H01L 24/06* (2013.01); *H01L 24/13* (2013.01); *H01L 24/16* (2013.01); *H01L 24/48* (2013.01); *H01L 2224/0401* (2013.01); *H01L 2224/04042* (2013.01); *H01L 2224/05557* (2013.01); *H01L 2224/05571* (2013.01); *H01L 2224/05611* (2013.01); *H01L 2224/05613* (2013.01); *H01L 2224/05616* (2013.01); *H01L 2224/05639* (2013.01); *H01L 2224/05644* (2013.01); *H01L 2224/05647* (2013.01); *H01L 2224/05655* (2013.01); *H01L 2224/06155* (2013.01); *H01L 2224/131* (2013.01); *H01L 2224/13147* (2013.01); *H01L 2224/16145* (2013.01); *H01L 2224/16225* (2013.01); *H01L 2224/48091* (2013.01); *H01L 2224/48227* (2013.01); *H01L 2224/73204* (2013.01); *H01L 2224/81192* (2013.01); *H01L 2224/85* (2013.01); *H01L 2225/0651* (2013.01); *H01L 2225/06513* (2013.01); *H01L 2225/06541* (2013.01); *H01L 2225/06568* (2013.01); *H01L 2225/1023* (2013.01); *H01L 2225/1058* (2013.01); *H01L 2924/00014* (2013.01); *H01L 2924/1305* (2013.01); *H01L 2924/1306* (2013.01); *H01L 2924/13091* (2013.01); *H01L 2924/15311* (2013.01); *H01L 2924/15321* (2013.01); *H01L 2924/181* (2013.01); *H01L 2924/18161* (2013.01)

(56) References Cited

U.S. PATENT DOCUMENTS

| | | | |
|---|---|---|---|
| 7,851,894 | B1 | 12/2010 | Scanlan |
| 8,058,101 | B2 | 11/2011 | Haba et al. |
| 8,378,476 | B2 | 2/2013 | Lee et al. |
| 8,409,923 | B2 * | 4/2013 | Kim et al. ............ 438/109 |
| 9,006,032 | B2 * | 4/2015 | Cheng et al. ........ 438/109 |
| 2009/0057918 | A1 | 3/2009 | Kim |
| 2010/0072600 | A1 | 3/2010 | Gerber |
| 2011/0233747 | A1 | 9/2011 | Lee et al. |

OTHER PUBLICATIONS

Lim, L. A., et al., "DreamPAK—Small Form Factor Package", EMPC 2009, pp. 1-6.

Tseng, Andy, et al., "Advanced QFN Surface Mount Application Notes Development", 2010 12th Electronics Packaging Technology Conference, pp. 737-742.

Servais, G. E., et al., "Wire Bonding—A Closer Look", The 17th International Symposium for Testing & Failure Analysis, Nov. 11-15, 1991, pp. 525-529.

* cited by examiner

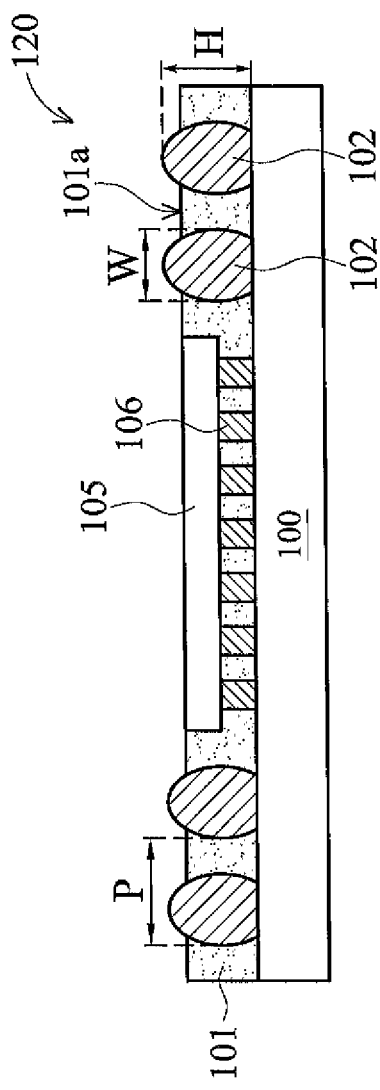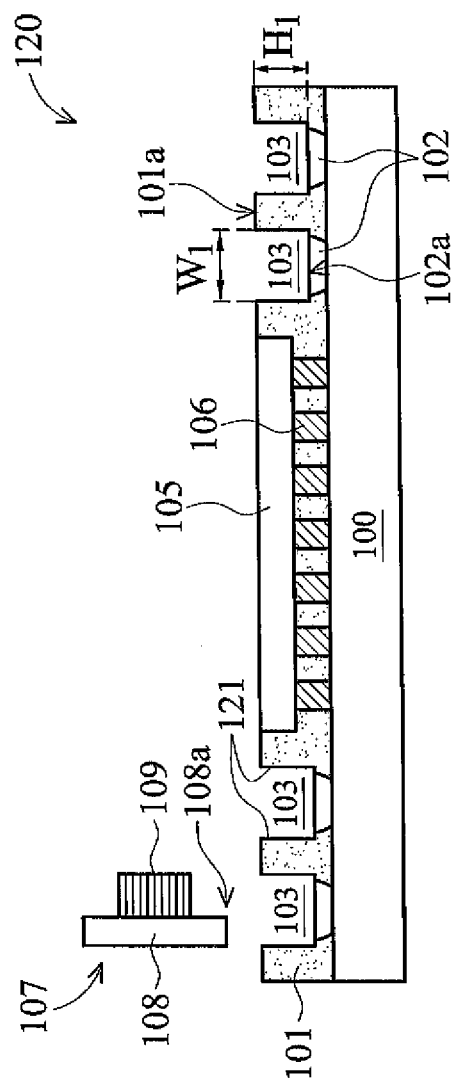

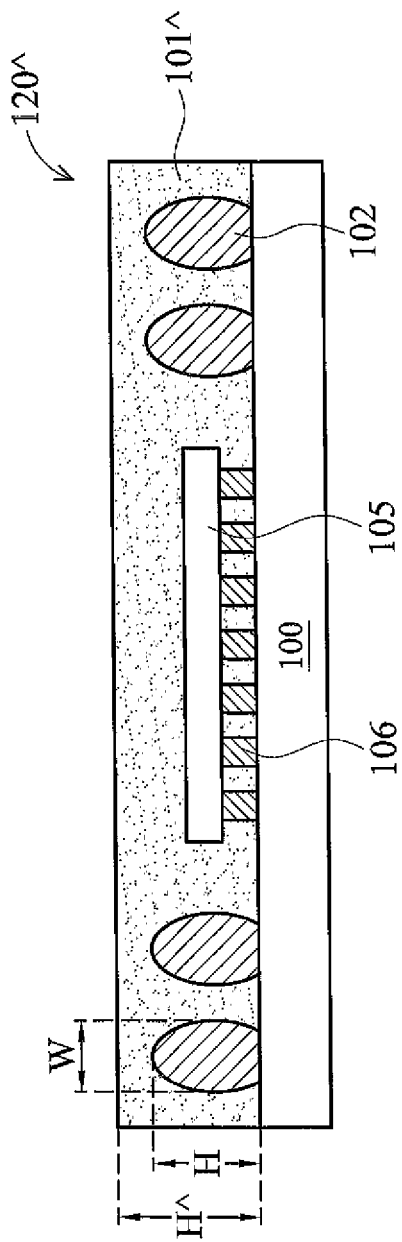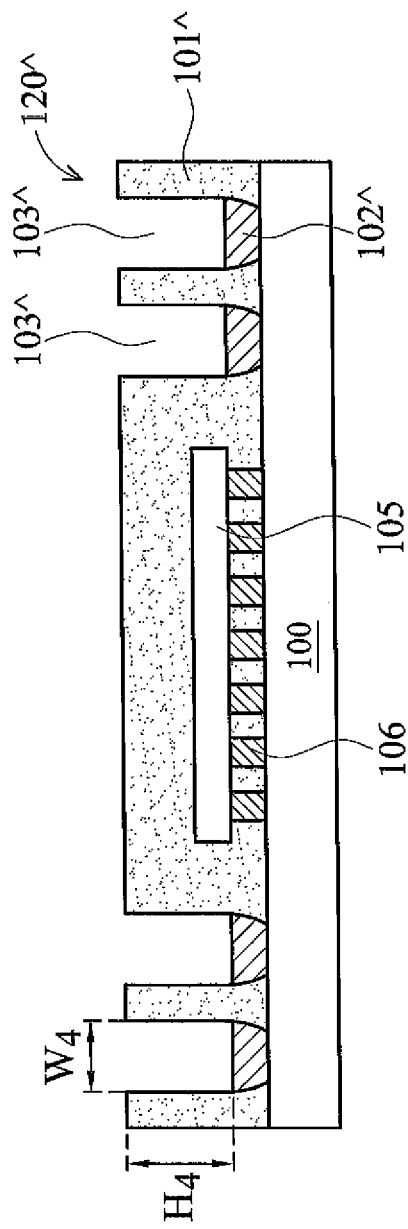
Fig. 5A
Fig. 5B

METHODS FOR FORMING A SEMICONDUCTOR DEVICE PACKAGE

PRIORITY CLAIM

The present application is a continuation of U.S. application Ser. No. 14/212,233, filed Mar. 14, 2014, now U.S. Pat. No. 9,006,032, issued Apr. 14, 2015, which is a continuation of U.S. application Ser. No. 13/586,629, filed Aug. 15, 2012, now U.S. Pat. No. 8,704,354, which claims the priority of U.S. Provisional Application No. 61/616,958, filed Mar. 28, 2012, which are incorporated herein by reference in their entireties.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1A, 1B, 1E, and 1F are cross sectional views of a sequential process of forming a package on a package (PoP) structure, in accordance with some embodiments.

FIG. 1E is a cross-sectional view of a package placed over another package, in accordance with some embodiments.

FIG. 1F is a cross-sectional view of a package bonded to another package, in accordance with some embodiments.

FIGS. 1A and 3A-3C are cross-sectional views of a sequential process of forming a package on a package (PoP) structure, in accordance with some embodiments.

FIGS. 1A and 4A-4C are cross-sectional views of a sequential process of forming a package on a package (PoP) structure, in accordance with some embodiments.

FIG. 5A-5D are cross sectional views of a sequential process of forming a package on a package (PoP) structure, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1C:
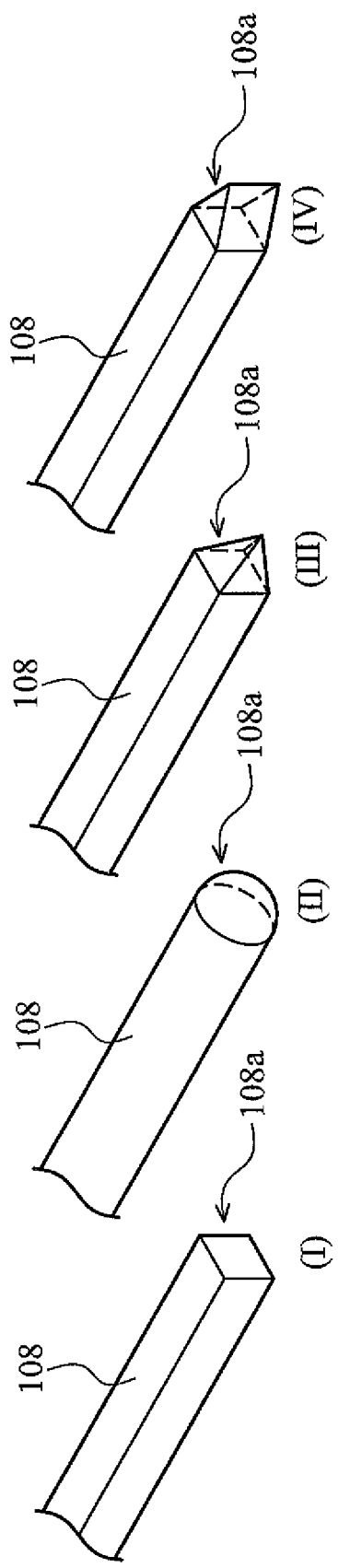
FIGS. 1C (I)-(IV) are various shapes of a tip of a material remover, in accordance with some embodiment.

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

FIGS. 1A, 1B, 1E, and 1F are cross sectional views of a sequential process of forming a package on a package (PoP) structure, in accordance with some embodiments. FIG. 1A is a cross-sectional view of a package 120, in accordance with some embodiments. Package 120 includes a semiconductor die 105. However, package 120 could include two or more semiconductor dies. The semiconductor die 105 includes a substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

Examples of the various microelectronic elements that may be formed in the semiconductor die 105 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Semiconductor die 105 is bonded to a substrate 100 by a number of connectors 106. In some embodiments, connectors 106 are bumps, such as solder bumps, copper pillar bumps, etc. Connectors 106 make contacts with conductive structures (not shown) on the surface of semiconductor die 105 and conductive structures (not shown) on the surface of substrate 100. Substrate 100 may be made of a semiconductor wafer, or a portion of wafer. In some embodiments, substrate 100 includes silicon, gallium arsenide, silicon on insulator ("SOI") or other similar materials. In some embodiments, substrate 100 include interconnect structures. In some embodiments, substrate 100 also includes passive devices such as resistors, capacitors, inductors and the like, or active devices such as transistors. In some embodiments, substrate 100 includes additional integrated circuits. Substrates 100 may further include through substrate vias (TSVs) and may be an interposer. In addition, the substrate 100 may be made of other materials. For example, in some embodiments, substrate 100 is a multiple-layer circuit board. In some embodiments, substrate 100 also includes bismaleimide triazine (BT) resin, FR-4 (a composite material composed of woven fiberglass cloth with an epoxy resin binder that is flame resistant), FR-5, ceramic, glass, plastic, tape, film, or other supporting materials that may carry the conductive pads or lands needed to receive conductive terminals.

Package 120 also includes a number of connectors 102 surrounding semiconductor die 105. The connectors 102 are embedded in a molding compound 101, which covers the space between semiconductor die 105, the connectors 102, and substrate 100, as shown in FIG. 1A in accordance with some embodiments. Connectors 102 are made of a conductive material, such as solder, solder alloy, etc. Connectors 102 are formed on conductive structures (not shown) on the surface of substrate 100 to electrically connect to elements in substrate 100. Connectors 102 also can be used to make electrical contacts with conductive elements on a packaged die (not shown and to be described below) placed over package 120. The largest width of a connector 102 is W and the height of the connector 102 is H. In some embodiments, W is in a range from about 100 μm to about 350 μm. In some embodiments, H is in a range from about 100 μm to about 300 μm. The pitch P of connectors 102 is a range from about 200 μm to about 400 μm, in some embodiments.

FIG. 1B shows a cross sectional view of package 120 and a material removal tool 107, in accordance with some embodiments. The material removal tool 107 is used to remove a portion of connectors 102 and a portion of molding compound 101 surrounding the removed conductive material of connectors 102. The material removal tool 107 may include a material remover 108 and a holder 109 to hold the material remover 108 and to control its movement. Material remover 108 is made of a material with a hardness that allows material remover 108 to remove at least portions of connectors 102 and molding compound 101. In some embodiments, material remover 108 includes diamond, at least at the tip 108a. The tip 108a of material remover 108 could be in various shapes, such as a rectangular shape 108a (I), a hemispherical shape 108a (II), a pyramid shape 108a (III), or a blade-tip shape 108a (IV) as shown in FIG. 1C in accordance with some embodiments. The shapes of tip 108a shown in FIG. 1C are merely examples. Other shapes are also possible, as long as they allow removal at least portions of connectors 102 and molding compound 101.

In some embodiments, the holder 109 is connected to a controlling system (not shown), which is used to control the removal of materials of connectors 102 and molding compound 101. Packages similar to package 102 can be processed in a processing system to remove at least portions of connectors 102 and molding compound 101 on each package. The processing system includes the controlling system, which is programmed to perform repeated processing on each package 102 to enable consistent removal results.

The material removal tool 107 removes a portion of each connector 102 and its surrounding molding compound 101 to create openings 103 to host connectors from a package (not shown) to be placed over package 120. FIG. 1B shows that each of the openings 103 has a width $W_1$ and a depth $H_1$, measured from a surface of molding compound 101, in accordance with some embodiments. In some embodiments, the depth $H_1$ is equal to or greater than half of the height H of the connector 102. In some embodiments, the depth $H_1$ is in a range from about 50 μm to about 250 μm. There is at least a portion of conductive material remaining in each connector 102 below each opening 103, in accordance with some embodiments. The surface 102a of the remaining connectors 102 is substantially flat and linear in accordance with some embodiments. In some embodiments, the surface 102a is curved. The width $W_1$ is equal to or greater than the maximum width W of connectors 102, in some embodiments. In some embodiments, the width $W_1$ is in a range from about 100 μm to about 350 μm.

Figure 1D:
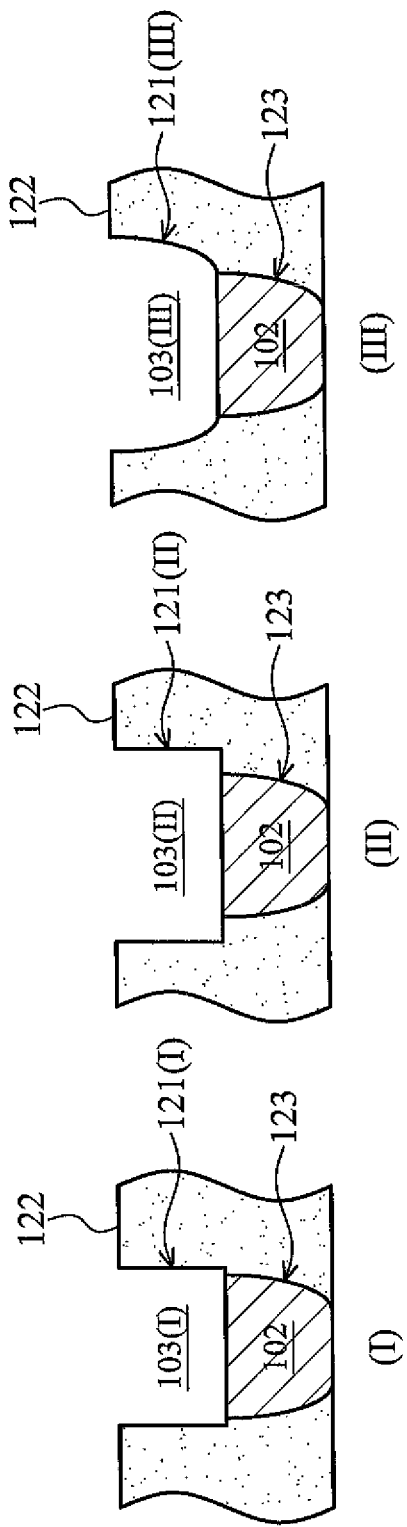
FIG. 1D (I)-(III) are various shapes of an opening above a connector, in accordance with some embodiments.

During the removal of the connector material in connectors 102, the molding compound 101 near openings 103 is also removed. Some molding compound 101a remains between neighboring connectors 102 in one direction. In some embodiments, the sidewalls 121 of openings 103 (I) are straight and are substantially perpendicular to a surface 122 of molding compound 101, as shown in FIG. 1D (I), in accordance with some embodiments. The sidewall 121(I) of opening 103 (I) of FIG. 1D (I) is substantially continuous with an interface 123 between the molding compound 101 and remaining connector 102. In some embodiments, the sidewall 121(II) of opening 103(II) extends beyond the interface 123 between the molding compound 101 and remaining connector 102, as shown in FIG. 1D (II) in accordance with some embodiments. In some embodiments, the sidewall 121(II) of opening 103(III) is curved and follows the initial profile of connector 102, as shown in FIG. 1D (III) in accordance with some embodiments.

Figure 1E:
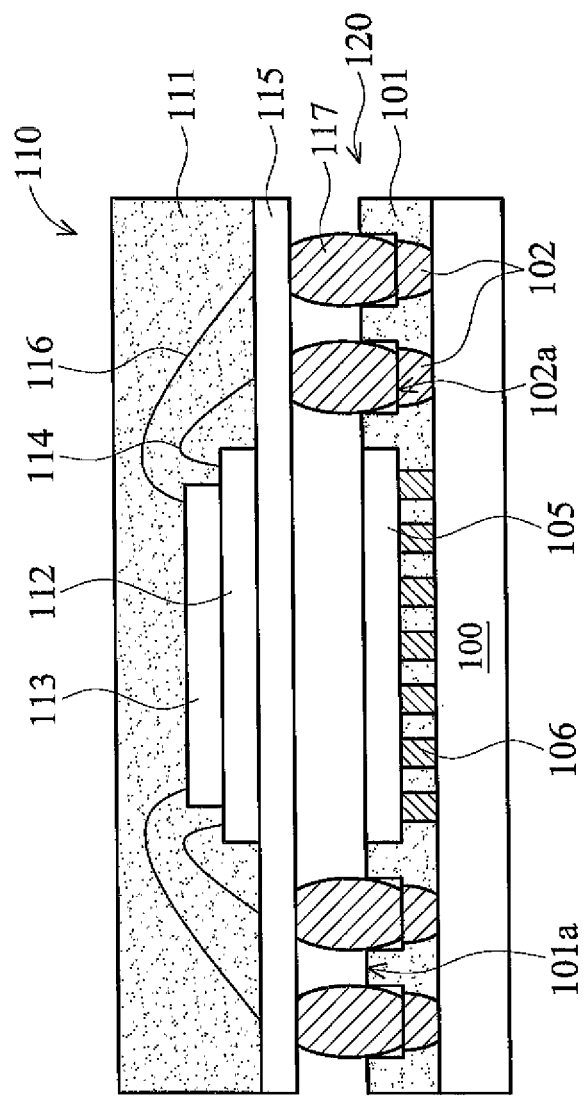

After openings 103 are formed, a package 110 is placed above package 120, as shown in FIG. 1E in accordance with some embodiments. Package 110 includes a two semiconductor dies 112 and 113, with die 113 disposed over die 112. However, package 110 could include one semiconductor die or more than two semiconductor dies. In some embodiments, there is a glue layer (not shown) between dies 112 and 113. Semiconductor dies 112 and 113 may include various microelectronic elements, as described above for semiconductor die 105. The examples of these various microelectronic elements have been described above. Semiconductor die 112 is bonded to a substrate 115. Substrate 115 may include various materials and/or components described above for substrate 100. Semiconductor die 112 is electrically connected to conductive elements (not shown) in substrate 115 via bonding wires 114, in accordance with some embodiments. Similarly, semiconductor die 113 is electrically connected to the conductive elements in substrate 115 via bonding wires 116. Package 110 also includes a molding compound 111, which covers semiconductor dies 112 and 113, and also bonding wires 114 and 116.

Package 110 also includes a number of connectors 117 surrounding semiconductor die 105, in accordance with some embodiments. Connectors 117 are made of a conductive material, such as solder, solder alloy, etc. Connectors 117 are formed on conductive structures (not shown) on the surface of substrate 115 to electrically connect to elements in substrate 115. Connectors 117 are placed in the openings 103, as shown in FIG. 1E in accordance with some embodiments.

The connectors 102 and 117 can be made of any conductive materials with low resistivity. For example, they can be made of solder, solder alloy, gold, gold alloy, etc. Exemplary elements included in a solder alloy may include Sn, Pb, Ag, Cu, Ni, bismuth (Bi), or combinations thereof.

Figure 1F:
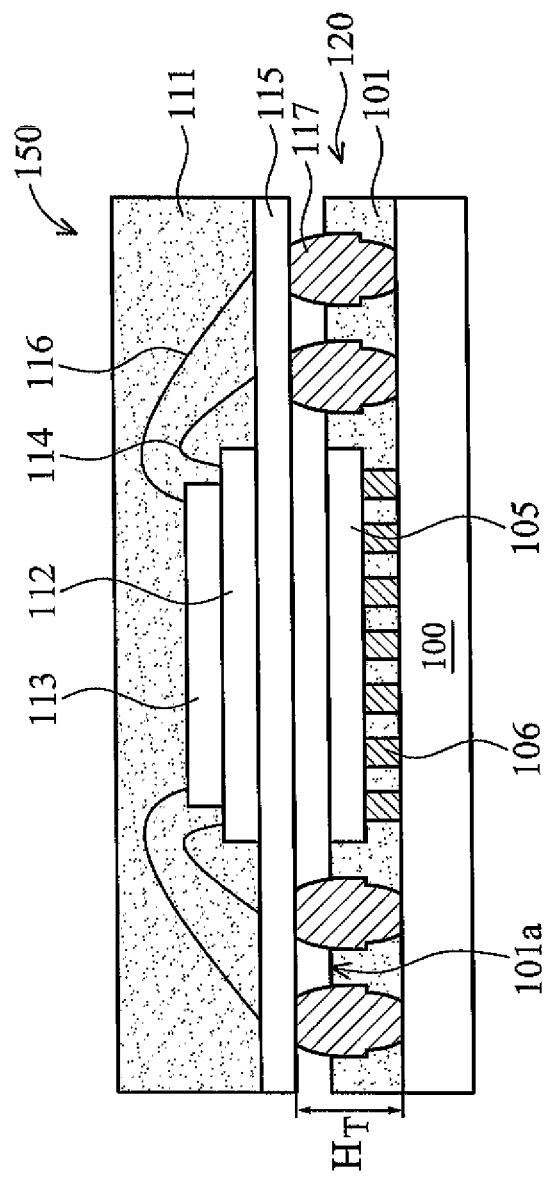
Figure 3A:
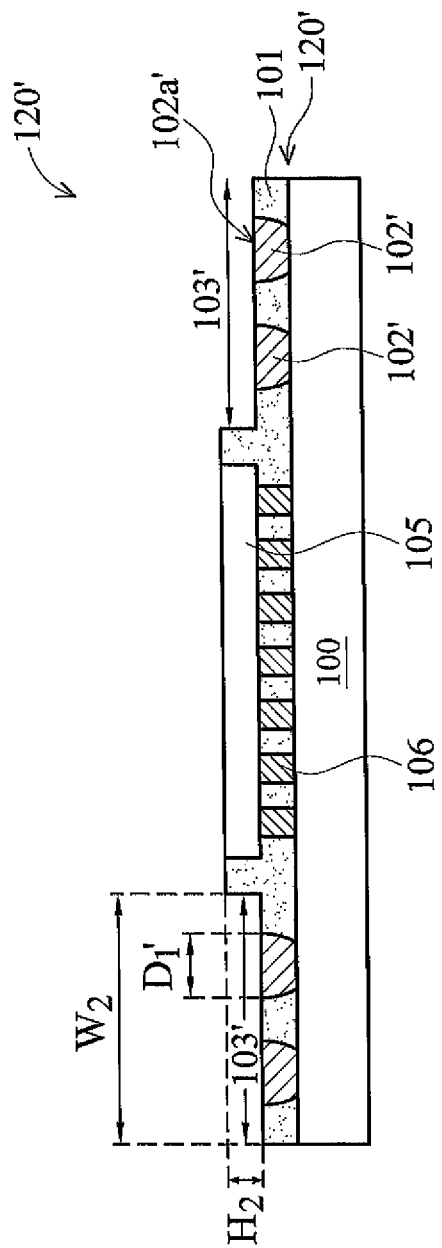

After package 110 is placed over package 120 with connectors 117 of package 110 placed in openings 103' of package 120' (as depicted in FIG. 3A), the package on package structure 150 is reflowed, as shown in FIG. 1F in accordance with some embodiments. After the reflow process, the remaining conductive material of connectors 102 in openings 103 mixes with the conductive material of connectors 117 to form a bonding structures 118. For example, the conductive material of connectors 102 and the conductive material of connectors 117 both include solder. The solder in connectors 102 and the solder connectors 117 mix and merge to form bonding structures 118. The distance (or height) $H_T$ between the bottom surface of package 110 and upper surface of substrate 100 is in a range from about 100 µm to about 350 µm. $H_T$ is also the height of the bonding structure 118. The distance $H_T$ of package structure 150 would be smaller than similar package on package structure that is prepared by bonding connectors 117 with connectors 102 that are not partially removed to form openings 103. Therefore, the form factor is better by using this bonding structure and method. In addition, since connectors 117 are placed in openings 103, the placement and alignment are more accurate. As a result, the chance of shorting between bonding structures 118 is greatly reduced, in comparison to similar bonding structures prepared by bonding connectors 117 with connectors 102 that are not partially removed to form openings 103. Therefore, the process window of the bonding process is wider. With the reduced chance of shorting between bonding structures 118, the pitch P of connectors 102 (and also connectors 117) may be reduced.

Figure 1G:
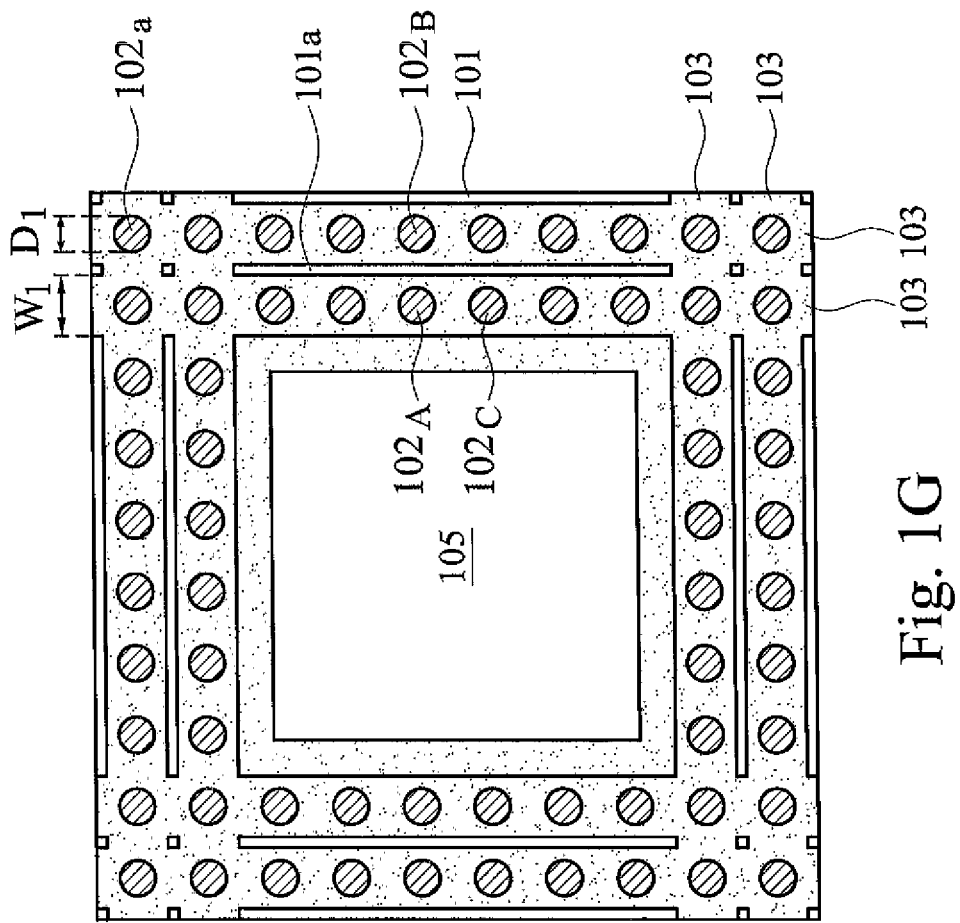
FIG. 1G is a top view of package after openings over connectors are formed, in accordance with some embodiments.

FIG. 1G is a top view of package 120 after openings 103 are formed, in accordance with some embodiments. In FIG. 1G, openings 103 are in the shape of trough formed over a row or a column of connectors 102. However, openings 103 can be in the shape of multiple troughs formed over a row or a column of connectors 102, in some embodiments. The diameter "$D_1$" of surface 102a is smaller than the width $W_1$ of openings 103. FIG. 1G shows that molding compound 101a remains between neighboring connectors 102 in one direction, such as between connectors $102_A$ and $102_B$. However, the molding compound 101a between neighboring connectors in another direction, such as between connectors $102_A$ and $102_C$, is removed. During the placement and alignment of connectors 117 with connectors 102, the molding compound 101a between connectors 102 could assist with the placement of connectors 117. In addition, molding compound 101a may assist in isolating neighboring bonding structures 118 (in one direction).

Since openings 103 are formed over a row or a column of connectors 102, the processing time is relatively small. One or more material removal tools 107 may be used to quickly form openings 103. In contrast, an alternative formation method for a package on package structure similar to structure 150 involves drills openings in molding compound 101, which does not embed connectors 102, to allow connectors 117 to come in contact with conductive elements on substrate 100 would be much more time-consuming and require more precise drilling control in forming individual opening to house each connector 117.

Figure 2A:
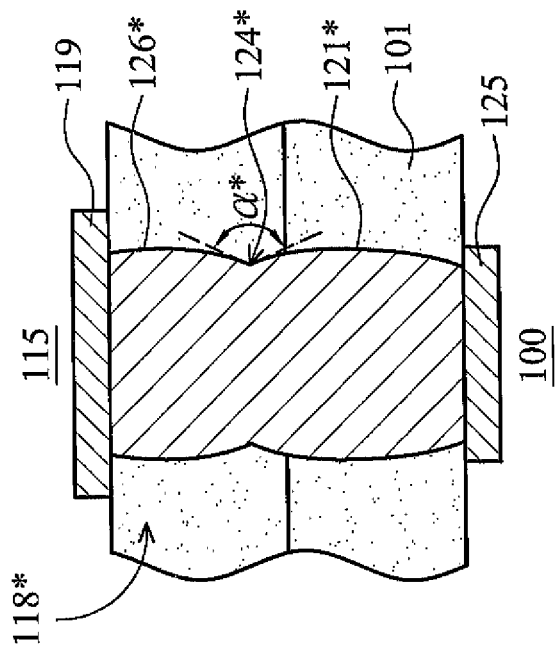
FIG. 2A is an expanded cross-sectional view of a bonding structure, in accordance with some embodiments.
Figure 2B:
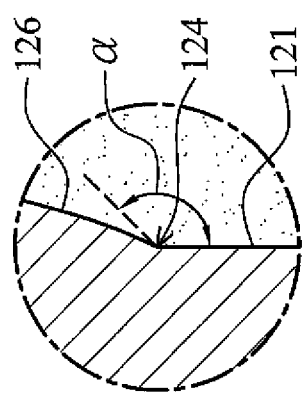
FIG. 2B is an expanded cross-sectional view of a portion of a bonding structure of FIG. 2A, in accordance with some embodiments.

FIG. 2A is an expanded cross-sectional view of bonding structure 118, in accordance with some embodiments. As described above, bonding structure 118 is formed by bonding conductive material of connector 117 with conductive material from the remaining connector 102, which exists originally below interface 102a. FIG. 2A shows that connector 117 is formed on a bond pad structure 119 in substrate 115 and connector 102 is formed on bonding structure 125 of substrate 100. FIG. 2A shows that bonding structure 118 has a curved surface 126 above molding compound 101, which is connected to a straight surface 121 in molding compound 101 at intersect 124. FIG. 2B shows a portion of bonding structure 118 with intersect (or neck) 124 and surfaces 121 and 126. The interfacial angle at intersect 124 is α. In some embodiments, α is in a range from about 90 degrees to less than about 180 degrees.

Figure 2C:
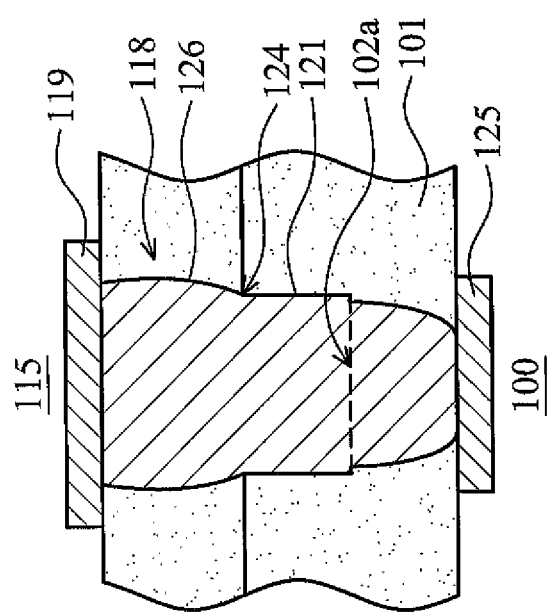
FIG. 2C is an expanded cross-sectional view of a bonding structure, in accordance with some other embodiments.

FIG. 2C is a cross-sectional view of a bonding structure 118*, which is formed by bonding connector 117 directly with connector 102 without forming opening 103 first in accordance with some embodiments. The bonding structure 118* is formed by a different method that is used in some manufacturing process. Since a portion of connector 102 and a portion of molding compound 101 were not removed to form opening 103, as in the case of FIG. 2A, bonding structure 118* has a curved surface 126* and a curved surface 121*, which meet at intersect 124*. The interfacial angle at intersect 124* is α*. In one or more embodiments, α is higher than α*. Due to smaller interfacial angle of intersect 124* of bonding structure 118* than intersect 124 of bonding structure 118, the stress is higher at intersect 124* than intersect 124. Higher stress would lead to increased likelihood of cracking. The bonding structure 118 has a smoother profile than bonding structure 118*. Therefore, the bonding structure 118 formed by the method described above reduces the likelihood of cracking of bonding structure compared to bonding structure of FIG. 2C. In addition, a bonding plane provided by surface 102a can be made consistent across package 120. As result, the bonding plane can be made flat, which increases a yield of the bonding process and also a form factor of consistent package height and planarity.

FIG. 3A is a cross-sectional view of package 120' after a portion of connectors 102 and a portion of molding compound 101 of package 120 (as shown in FIG. 1A) are removed to form large openings 103', in accordance with some embodiments. The molding compound 101 near and between connectors 102 is removed. In some embodiments, the width $W_2$ of openings 103' is equal to or greater than pitch P plus the maximum width W of connectors 102. In some embodiments, width $W_2$ is in a range from about 300 µm to about 1050 µm. In some embodiments, the molding compound 101 is removed all the way to the edges of package 120' as shown in FIG. 3A. In some embodiments, some molding compound 101 remains at the edge of package 120'.

The height $H_2$ of openings 103', as measured from the surface of molding compound 101 is equal to or greater than half of the height H of the connector 102. In some embodiments, the depth $H_2$ is in a range from about 50 µm to about 250 µm. There is at least a portion of conductive material remaining in each connector 102' below each opening 103', in accordance with some embodiments. The surface 102a' of the remaining connectors 102' is substantially flat and linear in accordance with some embodiments. In some embodiments, the surface 102a' is curved.

During the removal of the connector material in connectors 102, the molding compound 101 near openings 103 is also removed. Similar to the profiles of openings 103 as shown in FIGS. 1D (I), 1D (II), and 1D (III), the sidewalls 121' of openings 103' may be straight, extend beyond the interface 123, or being curved.

Figure 3B:
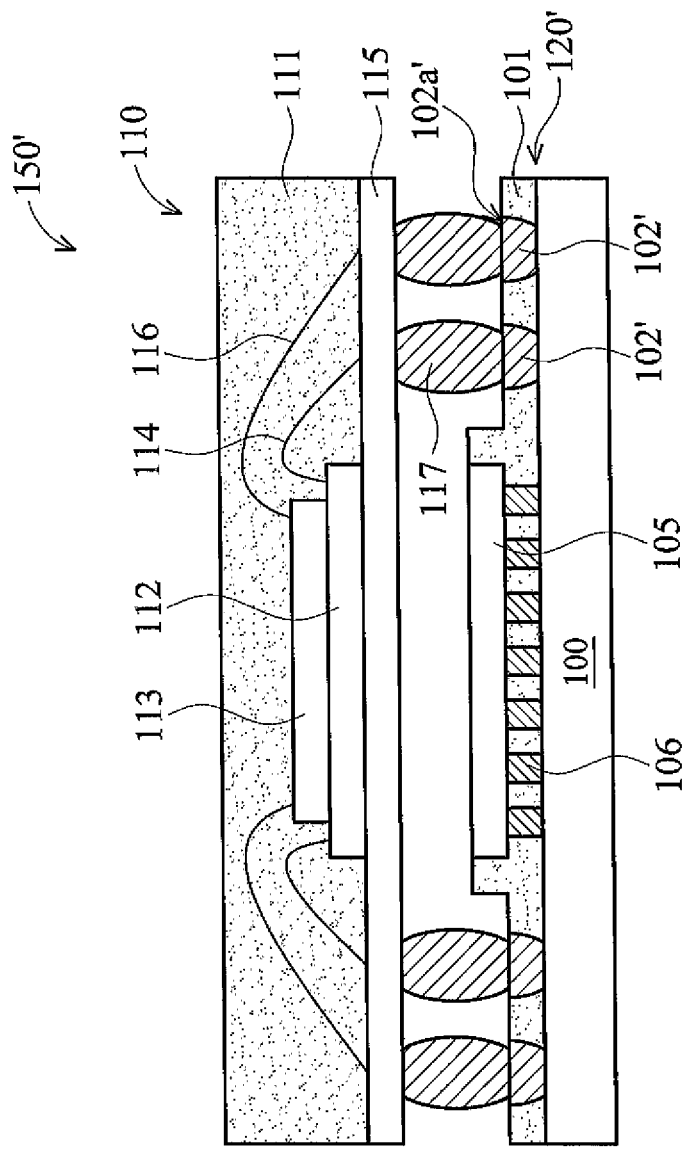

After openings 103' are formed, a packaged 110 is placed above package 120' to form package on package structure 150', as shown in FIG. 3B in accordance with some embodiments. Package 110 has been described above. As mentioned above, package 110 also includes a number of connectors 117 surrounding semiconductor die 105, in accordance with some embodiments. Connectors 117 are placed in openings 103' to make contacts with remaining connectors 102' in openings 103'.

Figure 3C:
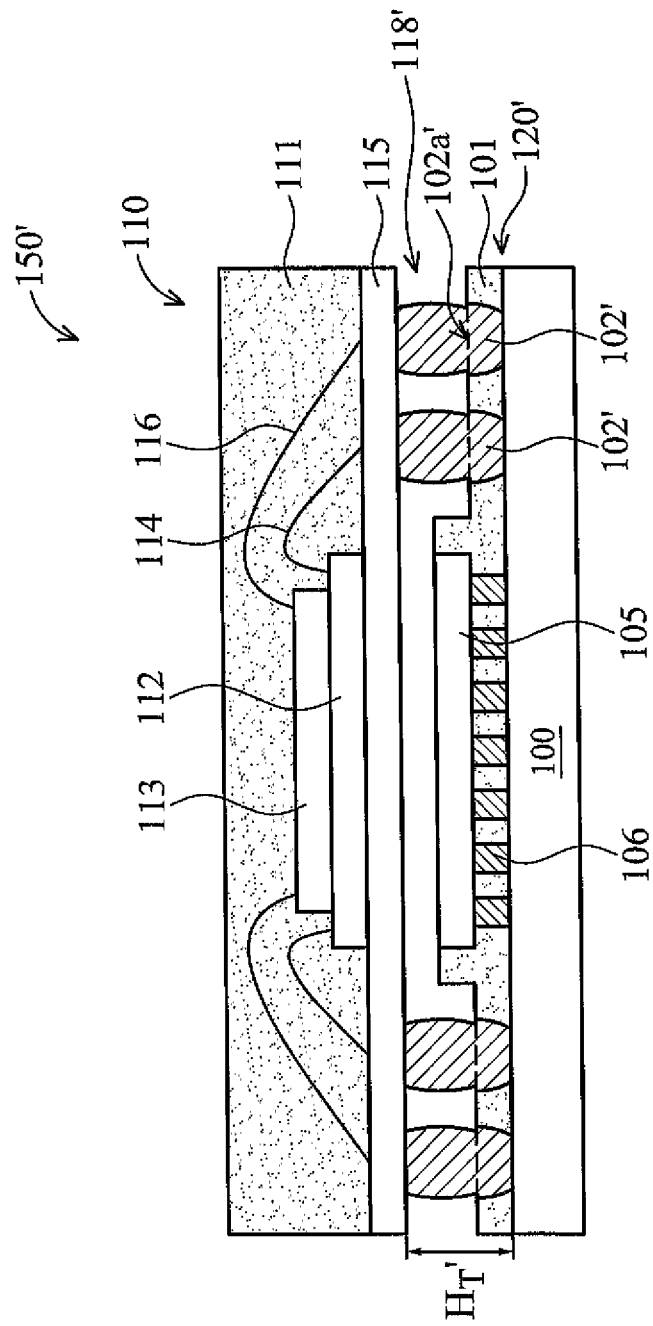

After package 110 is placed over package 120' with connectors 117 of package 110 placed in openings 103' of package 120', the package on package structure 150' is reflowed, as shown in FIG. 3C in accordance with some embodiments. After the reflow process, the remaining conductive material of connectors 102' in openings 103' mixes with the conductive material of connectors 117 to form a bonding structures 118'. As shown in FIG. 3C, the distance (or height) $H_T'$ between the bottom surface of package 110 and upper surface of substrate 100 is in a range from about 100 μm to about 350 μm.

Figure 3D:
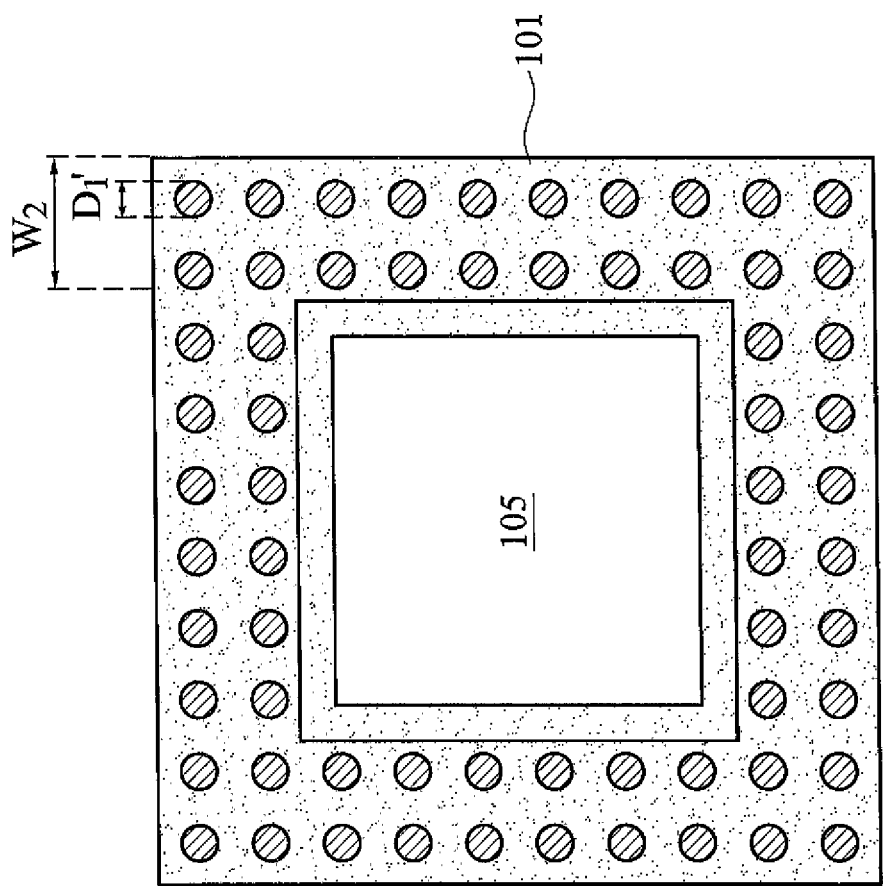
FIG. 3D is a top view of package after openings over connectors are formed, in accordance with some embodiments.

FIG. 3D is a top view of package 120' after openings 130' are formed, in accordance with some embodiments. Similar to $D_1$ described above, the diameter $D_1'$ of surface 102a' is smaller than the width $W_1$ of openings 103. FIG. 3D shows that the molding compound 101 is removed all the way to the edges of the package 120'.

The advantages of package structure 150' are similar to package structure 150 described above. Since the molding compound 101 between connectors 102' is also removed, the process control of the making openings 103' is easier and better than forming opening 103. However, the placement and alignment of connectors 117 on connectors 102' in openings 103' require slightly more precision than on connectors 102 in opening 103 due to complete removal of molding compound 101 between connectors 102'. Further, without the molding compound 101a between neighboring connectors 102', the placement and alignment of connectors 117 need to be more precise to ensure there is no shorting between bonding structures 118'.

Figure 4A:
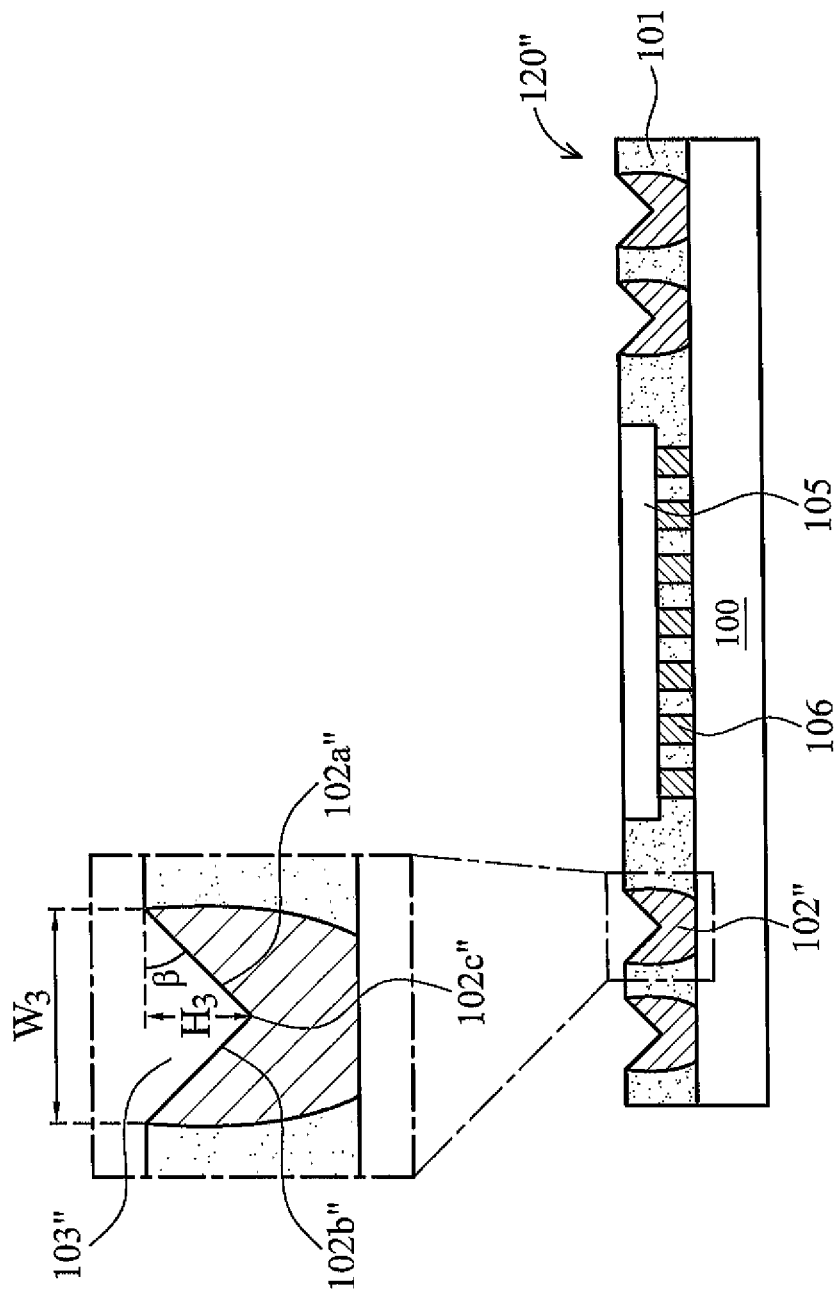

FIG. 4A is a cross-sectional view of package 120" after a portion of connectors 102 and a portion of molding compound 101 of package 120 (as shown in FIG. 1A) are removed to form large openings 103", in accordance with some embodiments. A portion of molding compound 101 near connectors 102 is removed. In some embodiments, the width $W_3$ of openings 103" is equal to or greater than the maximum width W of connectors 102. In some embodiments, width $W_3$ is in a range from about 100 μm to about 300 μm.

Figure 4B:
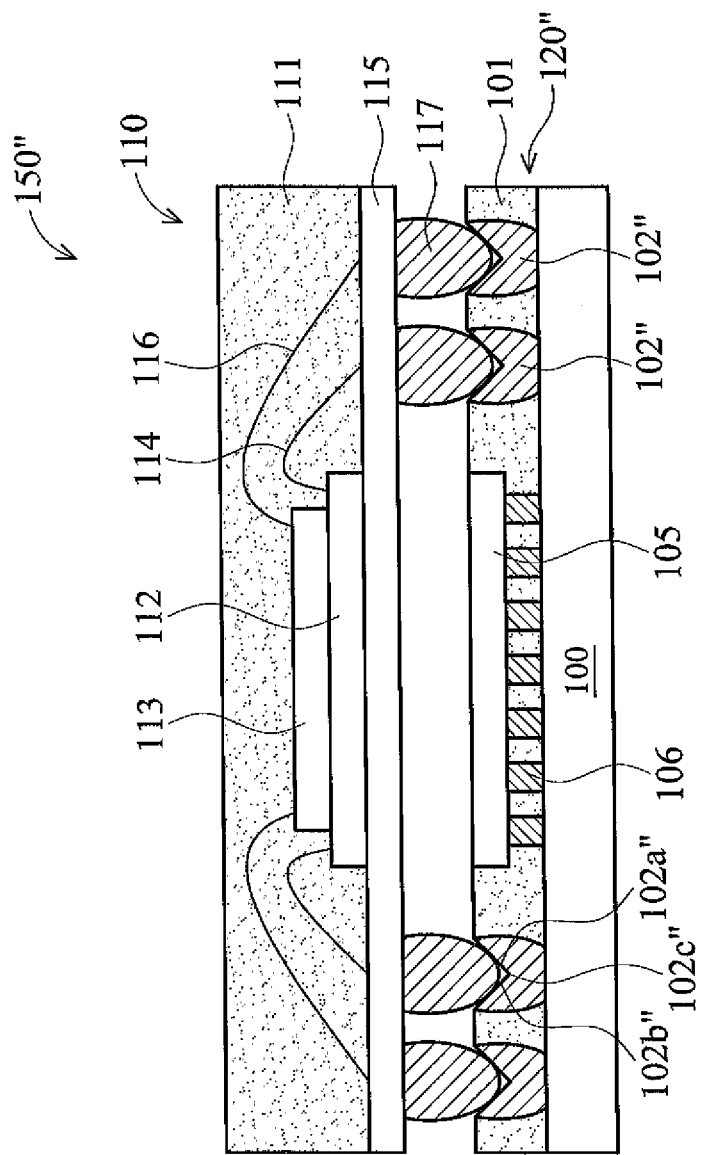
Figure 4C:
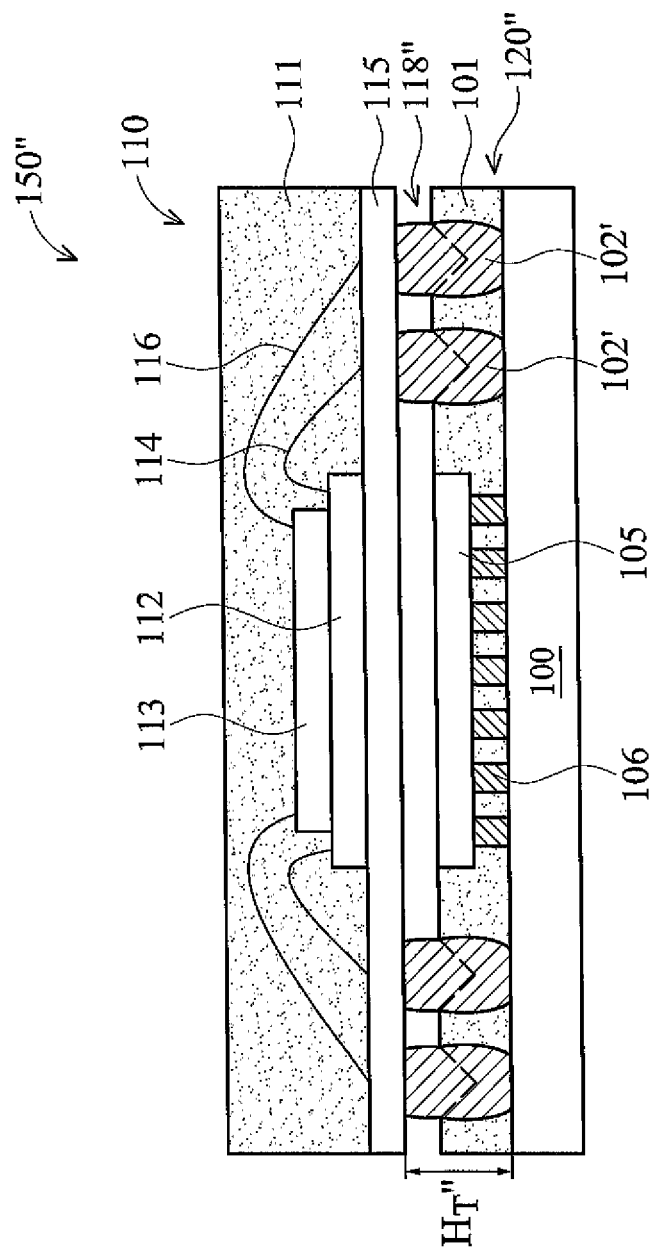

The height $H_3$ of openings 103", as measured from the surface of molding compound 101 is equal to or greater than half of the height H of the connector 102. In some embodiments, the depth $H_3$ is in a range from about 50 μm to about 250 μm. There is at least a portion of conductive material remaining in each connector 102" below each opening 103", in accordance with some embodiments. Material removal tools 107 described above are used to remove materials of connectors 102 and their surrounding molding compound 101. Each row or column of connectors 102" include at least two surfaces 102a" and 102b", as shown in FIG. 4A. Surfaces 102a" and 102b" meet at intersect 102c". The angle 13 between the top surface 122 of molding compound 101 and surface 102a" (or 102b") is in range from about 15° at about 45°, in accordance with some embodiments. Similar to package structure 150 and 150', a package 110 may also be placed on top of package 120" after openings 103" are formed to form a package structure 150" as shown in FIG. 4B in accordance with some embodiments. The surfaces 102a" and 102b" of openings 103" help the placement and alignment of connectors 117 in openings 103" and to make contacts with 102". Afterwards, the package structure 150" undergoes reflow to form bonding structures 118" and complete the formation of the package structure 150", as shown in FIG. 4C. The distance (or height) $H_T"$ between the bottom surface of package 110 and upper surface of substrate 100 is in a range from about 100 μm to about 350 μm.

Figure 4D:
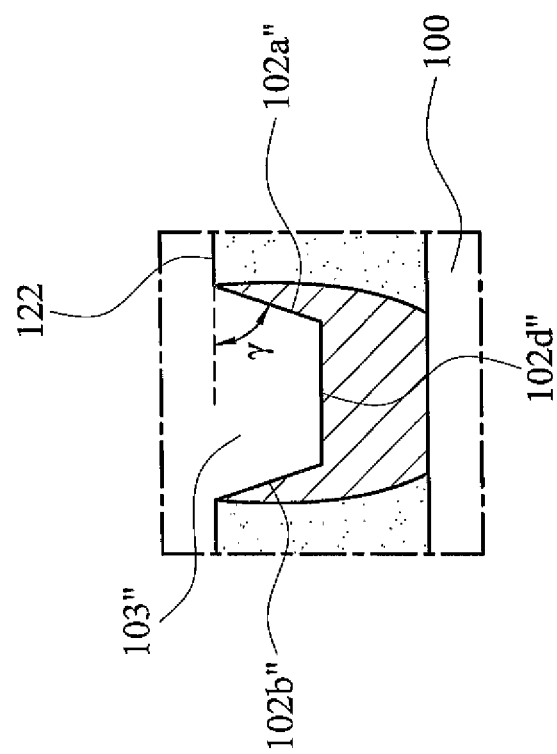
FIG. 4D is a cross-sectional view of an opening formed over a connector, in accordance with some embodiments.

FIG. 4B shows that openings 103" have at least two surfaces 102a" and 102b" intersecting at interface 102c". Openings 103" could also have different surfaces. FIG. 4D shows that surfaces 102a" and 102b" meet a surface 102d" to form openings 103" with a half V shape in accordance with some embodiments. The angle γ between the top surface 122 of molding compound 101 and surface 102a" (or 102b") of FIG. 4D is in range from about 45° at about 90°, in accordance with some embodiments.

After package 110 is placed over package 120' with connectors 117 of package 110 placed in openings 103' of package 120', the package on package structure 150' is reflowed, as shown in FIG. 3C in accordance with some embodiments. After the reflow process, the remaining conductive material of connectors 102 in openings 103' mixes with the conductive material of connectors 117 to form a bonding structures 118'. The distance (or height) $H_T'$ between a bottom surface of package 110 and an upper surface of substrate 100 is in a range from about 100 μm to about 350 μm.

Figure 4E:
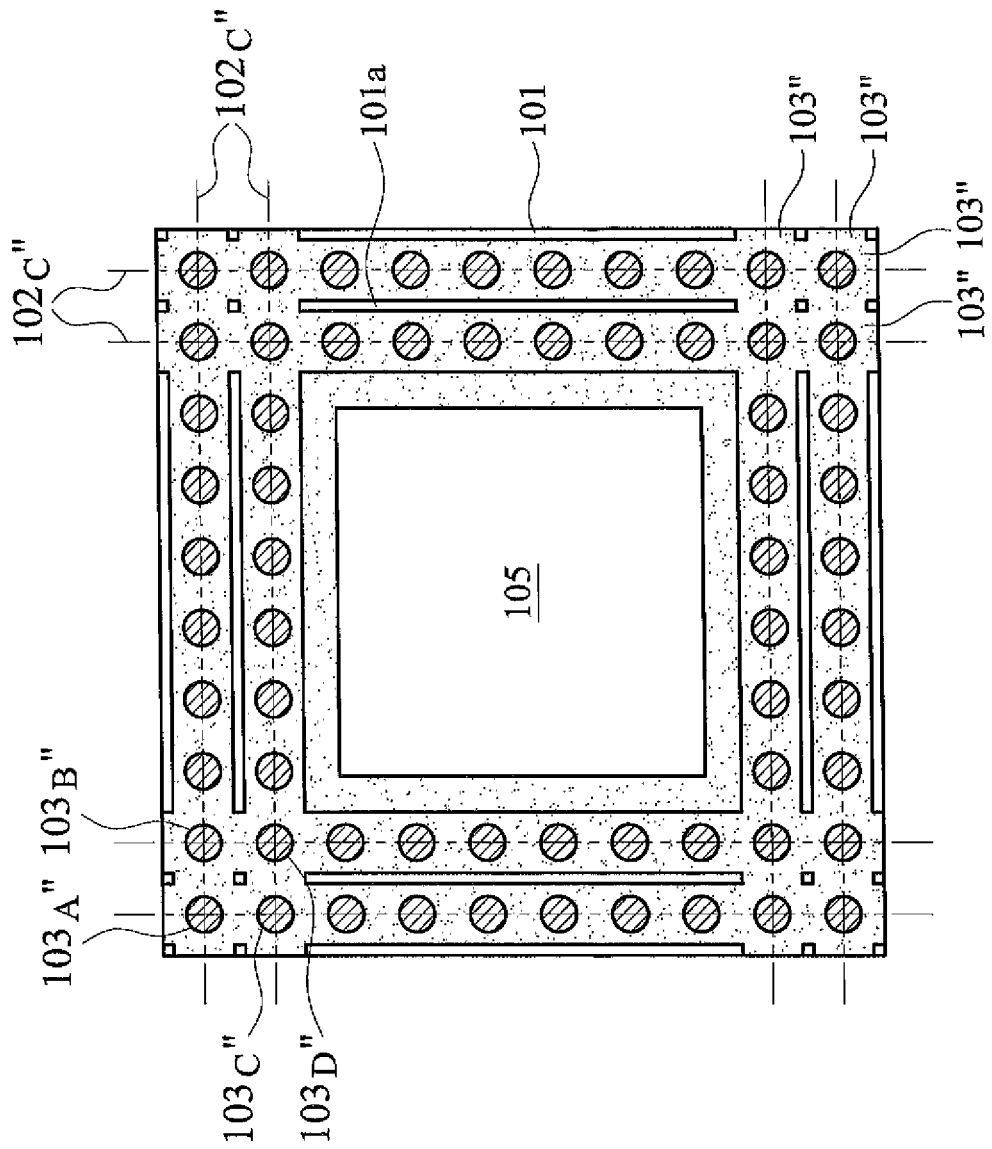
FIG. 4E is a top view of package after openings over connectors are formed, in accordance with some embodiments.

FIG. 4E is a top view of package 120" after openings 130" are formed, in accordance with some embodiments. In each row or column of openings 130", there is a line of intersect 102c". Each of corner openings $103_A"$, $103_B"$, 103" and $103_D"$ have four surfaces forming a pyramid shape, as shown in FIG. 4E in accordance with some embodiments. Corner openings, such as $103_A"$, $103_B"$, 103" and $103_D"$, with their pyramid-shape surfaces are very good at positioning connectors 117 accurately. The advantages of package structure 150" are similar to package structures 150 and 150' described above. Packaging structure 150" has the additional benefit of ease and accurate positioning of connectors 117 during the bonding process.

Figure 5C:
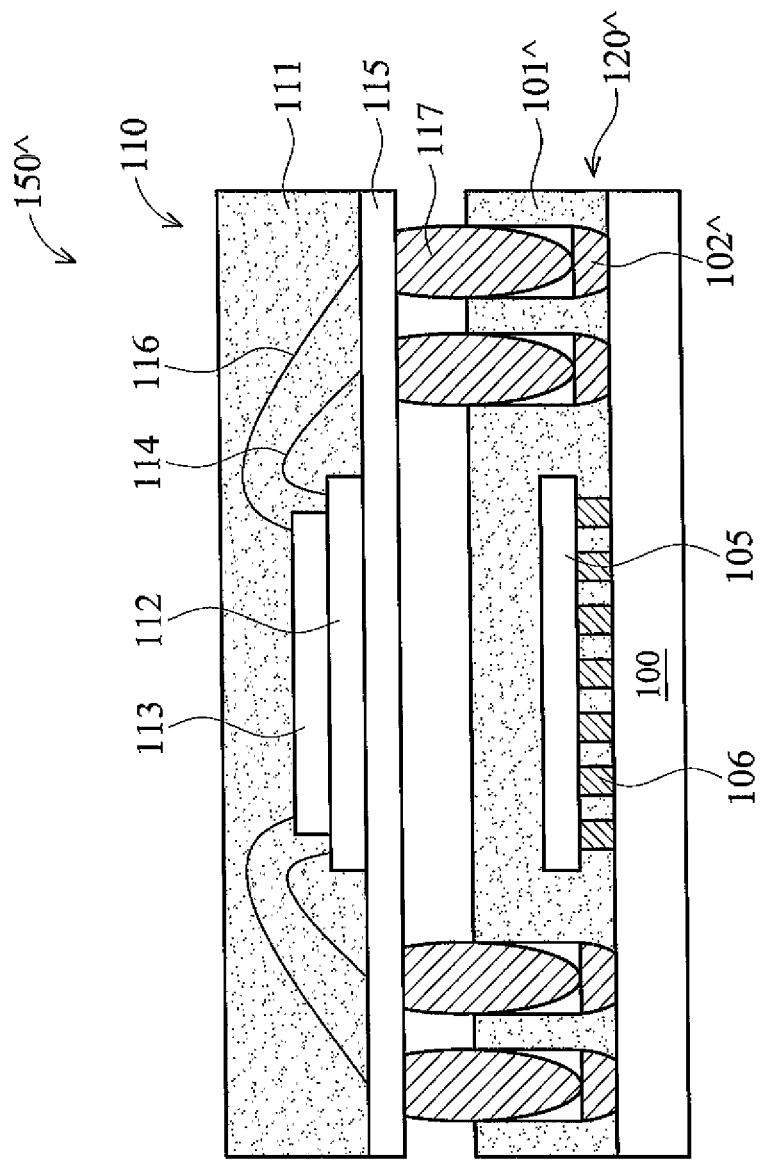

FIGS. 5A-5D are cross sectional views of a sequential process of forming a package on a package (PoP) structure, in accordance with some embodiments. FIG. 5A is a cross-sectional view of a package 120^, in accordance with some embodiments. Package 120^ is similar to package 120 and includes a semiconductor die 105. However, the molding compound 101^ covers semiconductor die 105 and connectors 102^. The process to make package 120^ is simpler than package 120 of FIG. 1A, because more complex process flow is needed to expose connectors 102 of FIG. 1A. As a result, the manufacturing cost of package 120^ is lower. The width W, the height H, and the pitch of connectors 102 have been described above. The height H^ of molding compound 101^ is taller than H, i.e. the height of connectors 102. In some embodiments, height H^ is in a range from about 110 μm to about 400 μm.

FIG. 5B is a cross-sectional view of package 120^ after a portion of connectors 102^ and a portion of molding compound 101^ of package 120^ are removed to form large openings 103^, in accordance with some embodiments. The molding compound 101^ surrounding connectors 102^ is thicker and could take longer time to remove and expose connectors 102. In some embodiments, the width $W_4$ of openings 103^ is equal to or greater than the maximum width W of connectors 102^. In some embodiments, width $W_4$ is in a range from about 100 μm to about 300 μm.

The height $H_4$ of openings 103^, as measured from the surface of molding compound 101^ is equal to or greater than half of the height H of the connector 102. In some embodiments, H4 is equal to or greater than about H^ (height of molding compound 101^) minus half of H (height of connectors 102), and is less than 85% of H. In some embodiments, the depth $H_4$ is in a range from about 60 μm to about 340 μm. There is at least a portion of conductive material remaining in each connector 102^ below each opening 103^, in accordance with some embodiments. The surface $102a$^ of the remaining connectors 102^ is substantially flat and linear in accordance with some embodiments. In some embodiments, the surface $102a$^ is curved.

After openings 103^ are formed, a package 110 is placed above package 120^ to form package on package structure 150^, as shown in FIG. 5C in accordance with some embodiments. Package 110 has been described above. As mentioned above, package 110 also includes a number of connectors 117 surrounding semiconductor die 105, in accordance with some embodiments. Connectors 117 are placed in openings 103^ to make contacts with remaining connectors 102^ in openings 103^.

Figure 5D:
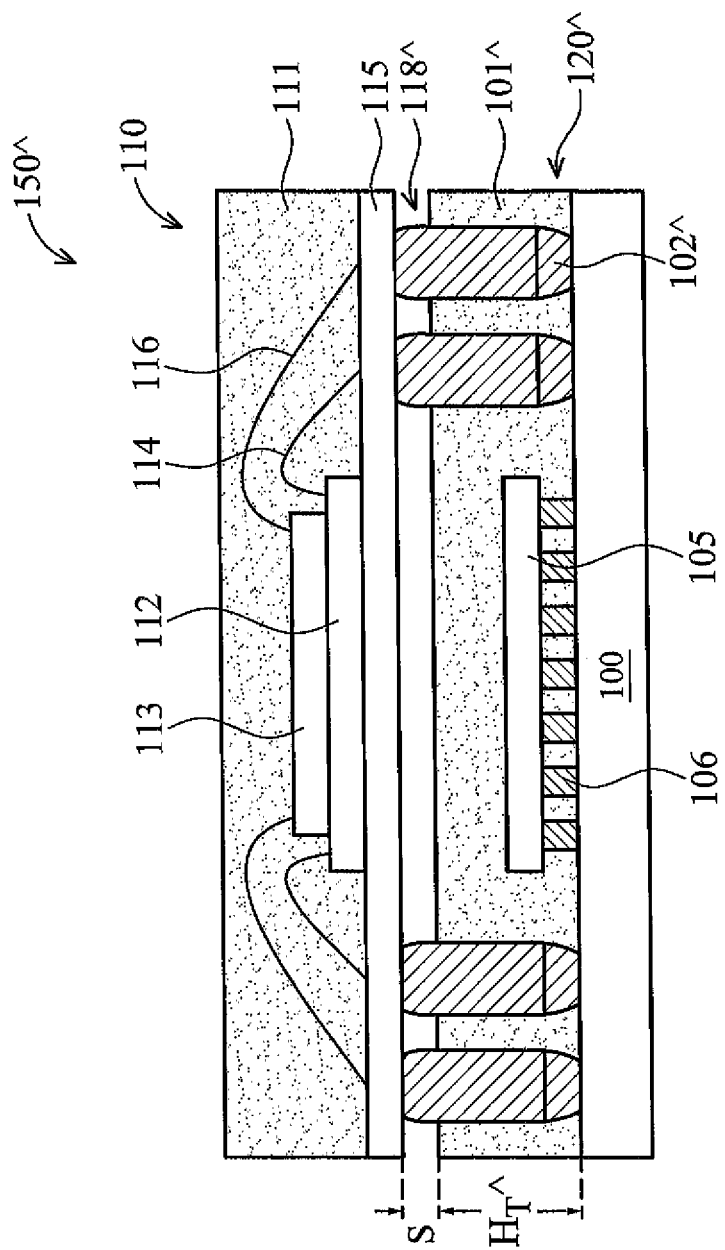

After package 110 is placed over package 120^ with connectors 117 of package 110 placed in openings 103^ of package 120^, the package on package structure 150^ is reflowed, as shown in FIG. 5D in accordance with some embodiments. After the reflow process, the remaining conductive material of connectors 102^ in openings 103^ mixes with the conductive material of connectors 117 to form a bonding structures 118^. The distance (or height) $H_T$^ between the bottom surface of package 110 and upper surface of substrate 100 is in a range from about 100 μm to about 350 μm. The advantages of package structure 150^ are similar to package structures 150, 150', and 150" described above. Due to $H_4$ being higher than $H_1$, $H_2$, or $H_3$, the bonding structures 118^ are stronger than bonding structures 118, 118', and 118" described above. In addition, the spacing S between packages 110 and 120^ is smaller than similar spacing between package structures 150, 150', and 150" described above. In some embodiments, the spacing S is in a range from about 10 μm to about 100 μm.

The described embodiments of forming bonding structures for package on package involves removing a portion of connectors and molding compound of the lower package. The described bonding mechanisms enable easier placement and alignment of connectors of an upper package to with connector of a lower package. As a result, the process window of the bonding process is wider. In addition, the bonding structures have smoother join profile and planar joint plane. As a result, the bonding structures are less likely to crack and also are less likely to crack. Both the yield and the form factor of the package on package structure are improved.

One aspect of this description relates to a method of forming a semiconductor device package. The method includes bonding a first connector to a first conductive structure on a first package. The method further includes bonding a die to a surface of the first package, wherein a top surface of the first connector extends above a top surface of the die. The method further includes surrounding the first connector with a molding compound. The method further includes removing a portion of the first connector and a portion of the molding compound, wherein, following the removing, the top surface of the first conductor is below the top surface of the die, a first top surface of the molding compound is below the top surface of the die, and a second top surface of the molding compound is substantially level with the top surface of the die. The method further includes placing a second connector in contact with the first connector, wherein the second connector is part of a second package. The method further includes bonding the second connector to a remaining portion of the first connector.

Another aspect of this description relates to a method of forming a semiconductor device package. The method includes forming a molding compound around a first connector, wherein the first connector is part of a first package including a die. The method further includes removing a portion of the first connector to form an opening, wherein a sidewall of the opening is angled with respect to a top surface of the molding compound. The method further includes placing a second connector in contact with the first connector, wherein the second connector is part of a second package. The method further includes bonding the second connector to a remaining portion of the first connector.

Still another aspect of this description relates to a method of forming a semiconductor device package. The method includes forming a molding compound around a first connector having a first height, wherein the first connector is part of a first package including a die, and the molding compound covers a top surface of the die. The method further includes removing a portion of the first connector to form an opening in the molding compound, wherein the molding compound remains over the top surface of the die following the removing. The method further includes placing a second connector in contact with the first connector, wherein the second connector is part of a second package. The method further includes bonding the second connector to a remaining portion of the first connector.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device package, the method comprising:
   bonding a first connector to a first conductive structure on a first package;
   bonding a die to a surface of the first package, wherein a top surface of the first connector extends above a top surface of the die;
   surrounding the first connector with a molding compound;
   removing a portion of the first connector and a portion of the molding compound, wherein, following the removing, the top surface of the first conductor is below the top surface of the die, a first top surface of the molding compound is below the top surface of the die, and a second top surface of the molding compound is substantially level with the top surface of the die;

placing a second connector in contact with the first connector, wherein the second connector is part of a second package; and bonding the second connector to a remaining portion of the first connector.

2. The method of claim 1, wherein a height difference between the top surface of the die and the top surface of the first conductor after the removing ranges from about 50 microns (μm) to about 250 μm.

3. The method of claim 1, wherein the top surface of the first connector after the removing is substantially flat.

4. The method of claim 1, wherein the top surface of the first connector after the removing is curved.

5. The method of claim 1, wherein the removing comprises forming an opening in the molding compound, and a width of the opening ranges from about 300 μm to about 1050 μm.

6. The method of claim 1, wherein bonding the second connector to the remaining portion of the first connector comprises defining a space between the first top surface of the molding compound and a bottom surface of the second package ranging from about 100 μm to about 350 μm.

7. A method of forming a semiconductor device package, the method comprising:

forming a molding compound around a first connector, wherein the first connector is part of a first package including a die;

removing a portion of the first connector to form an opening, wherein a sidewall of the opening is angled with respect to a top surface of the molding compound;

placing a second connector in contact with the first connector, wherein the second connector is part of a second package; and bonding the second connector to a remaining portion of the first connector.

8. The method of claim 7, wherein removing the portion of the first connector comprises forming the opening having a depth ranging from about 50 microns (μm) to about 250 μm.

9. The method of claim 7, wherein removing the portion of the first connector comprises forming the sidewall of the opening having an angle with respect to the top surface of the molding compound ranging from about 15° to about 45°.

10. The method of claim 7, wherein removing the portion of the first connector comprises forming the sidewall of the opening having an angle with respect to the top surface of the molding compound ranging from about 45° to about 90°.

11. The method of claim 10, wherein removing the portion of the first connector comprises forming a bottom surface of the opening substantially parallel to the top surface of the molding compound.

12. The method of claim 7, wherein forming the molding compound comprises forming the top surface of the molding compound substantially coplanar with a top surface of the die.

13. The method of claim 7, wherein placing the second connector in contact with the first connector comprises placing the second connector in contact with the angled sidewall.

14. The method of claim 7, wherein bonding the second connector to the remaining portion of the first connector comprises defining a space between the first top surface of the molding compound and a bottom surface of the second package ranging from about 100 μm to about 350 μm.

15. A method of forming a semiconductor device package, the method comprising:

forming a molding compound around a first connector having a first height, wherein the first connector is part of a first package including a die, and the molding compound covers a top surface of the die;

removing a portion of the first connector to form an opening in the molding compound, wherein the molding compound remains over the top surface of the die following the removing;

placing a second connector in contact with the first connector, wherein the second connector is part of a second package; and bonding the second connector to a remaining portion of the first connector.

16. The method of claim 15, wherein removing the portion of the first connector comprises forming the opening having a depth greater than half the first height.

17. The method of claim 15, wherein removing the portion of the first connector comprises forming the opening having a depth greater than or equal to a thickness of the molding compound minus half the first height.

18. The method of claim 15, wherein removing the portion of the first connector comprises forming the opening having a depth less than about 85% of the first height.

19. The method of claim 15, wherein bonding the second connector to the remaining portion of the first connector comprises forming a space between a top surface of the molding compound and a bottom surface of the second package ranging from about 10 microns (μm) to about 100 μm.

20. The method of claim 15, wherein forming the molding compound comprises forming the molding compound having a thickness ranging from about 110 μm to about 400 μm.

* * * * *